(12) United States Patent
Hughes

(10) Patent No.: US 12,707,754 B2
(45) Date of Patent: Aug. 11, 2026

(54) QUANTUM-PARTICLE CELL WITH PATTERNED TRANSPARENT CONDUCTIVE OXIDES

(71) Applicant: ColdQuanta, Inc., Boulder, CO (US)

(72) Inventor: Steven Michael Hughes, Louisville, CO (US)

(73) Assignee: ColdQuanta, Inc., Boulder, CO (US)

( * ) Notice: Subject to any disclaimer, the term of this patent is extended or adjusted under 35 U.S.C. 154(b) by 636 days.

(21) Appl. No.: 18/095,965

(22) Filed: Jan. 11, 2023

(65) Prior Publication Data

US 2023/0246117 A1 Aug. 3, 2023

Related U.S. Application Data

(63) Continuation-in-part of application No. 17/493,155, filed on Oct. 4, 2021, and a continuation-in-part of (Continued)

(51) Int. Cl.
*B82Y 20/00* (2011.01)
*H10F 71/00* (2025.01)
(Continued)

(52) U.S. Cl.
CPC ......... *H10F 71/138* (2025.01); *H10F 77/143* (2025.01); *H10F 77/247* (2025.01); *B82Y 20/00* (2013.01)

(58) Field of Classification Search
CPC .... H10F 71/138; H10F 77/247; H10F 77/143; B82Y 20/00; G02F 1/01791
See application file for complete search history.

(56) References Cited

U.S. PATENT DOCUMENTS 9,117,563 B2 8/2015 Hughes
9,701,581 B2 7/2017 Kangastupa
(Continued)

FOREIGN PATENT DOCUMENTS

EP 2505297 8/2016
TW I545662 8/2016

OTHER PUBLICATIONS

Hofmann et al., An Experimental Approach for Investigating Many-Body Phenomena in Rydberg-Interacting Quantum Systems, Jul. 3, 2013.

(Continued)

*Primary Examiner* — Chad M Dicke
*Assistant Examiner* — Valerie N Newton
(74) *Attorney, Agent, or Firm* — Young Basile Hanlon & MacFarlane P.C.

(57) ABSTRACT

A quantum-particle cell manufacturing process includes coating a substrate with transparent conductive oxide (TCO) such as indium tin oxide (ITO). Regions of the TCO are then transformed, e.g., by pulsed-laser annealing, to increase their resistivity. The annealed region then electrically isolates adjacent higher conductivity and lower resistivity regions, which can serve as field plates. At least one annealed region extends from the cell interior through a bond between the substrate and sidewalls and into the cell exterior so that adjacent unannealed regions can serve as independently controllable feedthroughs. The annealing does not significantly affect the TCO thickness so the bond between the substrate and the sidewall structure remains intact and the completed quantum particle cell can be hermetically sealed.

21 Claims, 7 Drawing Sheets

Related U.S. Application Data application No. 17/340,039, filed on Jun. 6, 2021, now Pat. No. 11,997,780.

(60) Provisional application No. 63/150,440, filed on Feb. 17, 2021, provisional application No. 63/044,571, filed on Jun. 26, 2020.

(51) Int. Cl.
*H10F 77/14* (2025.01)
*H10F 77/20* (2025.01)

(56) References Cited

U.S. PATENT DOCUMENTS 9,763,314 B1 9/2017 Roper
9,837,177 B1 12/2017 Roper
9,960,025 B1 5/2018 Hughes
10,629,417 B1 4/2020 Hughes
10,755,831 B2 8/2020 Anderson
11,150,609 B1 10/2021 Parazzoli
11,257,605 B2 2/2022 Anderson
11,320,588 B1 5/2022 Mazed
11,397,085 B1 7/2022 Anderson
11,415,614 B2 8/2022 Salim
11,592,469 B2 2/2023 Anderson
11,733,655 B2 8/2023 Salim
11,776,797 B2 10/2023 Hughes
2006/0267023 A1 11/2006 McBride
2007/0001579 A1 1/2007 Jeon
2010/0033256 A1 2/2010 Strabley
2010/0213367 A1 8/2010 Miller
2011/0186728 A1 8/2011 Franzen
2013/0280440 A1* 10/2013 Zhang .................. H10F 77/244 427/554
2013/0344302 A1 12/2013 Hélie
2014/0218802 A1 8/2014 Saito
2015/0244382 A1* 8/2015 Ishihara ................. G04F 5/145 29/458
2015/0259816 A1 9/2015 Minsek
2016/0023401 A1* 1/2016 Fujii ................... B23K 26/324 156/272.8
2016/0126965 A1* 5/2016 Hashi ..................... G04F 5/145 156/60
2016/0308543 A1 10/2016 Ishihara
2017/0133210 A1 5/2017 Tanaka
2017/0331485 A1* 11/2017 Gobet ...................... G04F 5/14
2018/0212612 A1 7/2018 Park
2018/0233337 A1 8/2018 Hughes
2018/0233338 A1 8/2018 Hughes
2018/0351116 A1 12/2018 Wada
2019/0027355 A1 1/2019 Kim
2019/0041550 A1* 2/2019 Ganjoo .................. C03C 17/22
2019/0109597 A1 4/2019 Matsuda
2019/0293923 A1 9/2019 Ghahremani
2019/0322577 A1 10/2019 Dussauze
2021/0335591 A1 10/2021 Kim
2021/0410266 A1 12/2021 Saffman
2022/0084709 A1 3/2022 Hughes
2022/0196716 A1 6/2022 Anderson
2022/0262609 A1 8/2022 Hughes
2022/0291268 A1 9/2022 Anderson
2023/0169385 A1 6/2023 Meinert et al.
2023/0246117 A1 8/2023 Hughes

OTHER PUBLICATIONS

Lee et al., Sealing Success: Developing a Photonics Packaging Company, Aug. 26, 2020.
Vrijsen et al., Efficient Isotope-Selective Pulsed Laser Ablation Loading of 174Yb+ Ions in a Surface Electrode Trap, Research Article, Optics Express, vol. 27, No. 23, Nov. 11, 2019, Optics Express 33907.
Watanabe et al., Direct Joining of Glass Substrates by 1kHz Femtosecond Laser Pulses, Applied Physics B, Laser and Optics, Appl. Phys. B 87, pp. 85-89, 2007.
Chuang et al., The fabrication of through-wafer interconnects in silicon substrates for ultra-high-vacuum atom-optics cells, Journal of Micromechanics and Microengineering, published Feb. 22, 2008.
Grzebyk et al., Lateral MEMS-type field emission electron source, IEEE Transactions on Electron Devices, vol. 63, No. 2, Feb. 1, 2016, pp. 809-813.
Miyamoto et al., Novel fusion welding technology of glass using ultrashort pulse lasers, Physics Procedia 5, 2010, pp. 483-493.
Salim et al., Compact, microchip-based systems for practical applications of ultracold atoms, Quantum Inf Process 10, 2011, pp. 975-994.

* cited by examiner

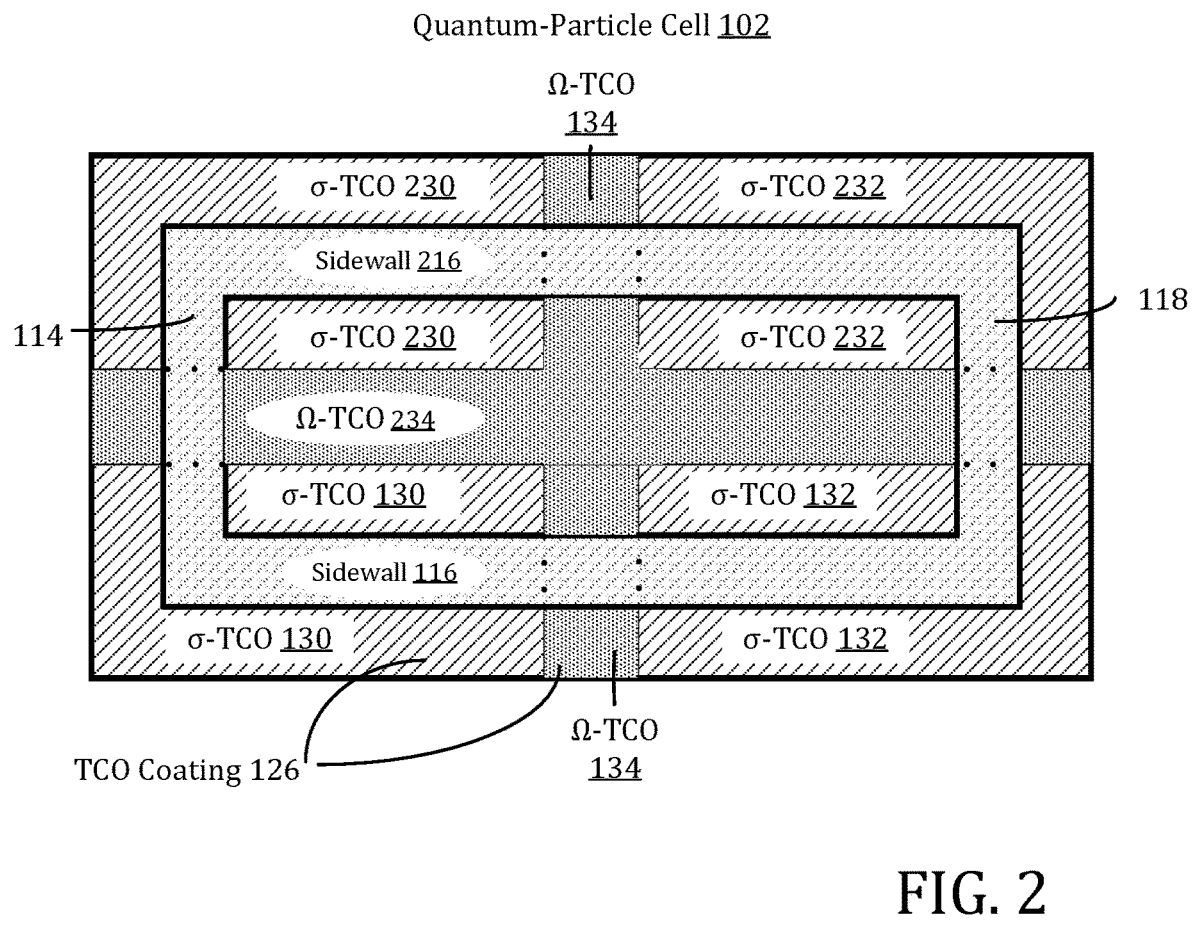

Quantum-Particle Cell 102

Ω-TCO 134

σ-TCO 230

σ-TCO 232

Sidewall 216

114

118

σ-TCO 230

σ-TCO 232

Ω-TCO 234

σ-TCO 130

σ-TCO 132

Sidewall 116

σ-TCO 130

σ-TCO 132

TCO Coating 126

Ω-TCO 134

FIG. 2

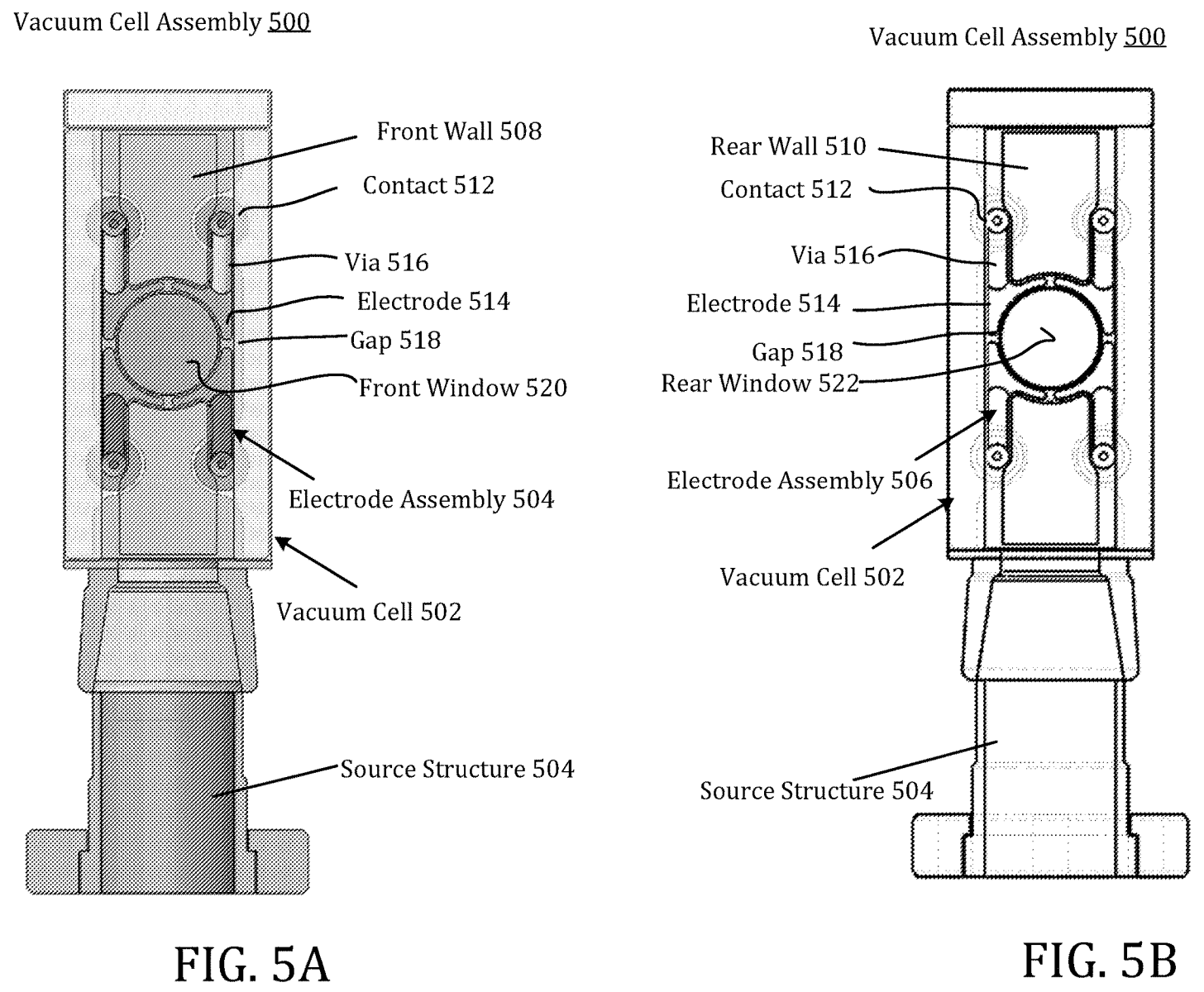

Vacuum Cell Assembly 500

Front Wall 508
Contact 512
Via 516
Electrode 514
Gap 518
Front Window 520
Electrode Assembly 504
Vacuum Cell 502
Source Structure 504

FIG. 5A

Vacuum Cell Assembly 500

Rear Wall 510
Contact 512
Via 516
Electrode 514
Gap 518
Rear Window 522
Electrode Assembly 506
Vacuum Cell 502
Source Structure 504

FIG. 5B

QUANTUM-PARTICLE CELL WITH PATTERNED TRANSPARENT CONDUCTIVE OXIDES

CROSS REFERENCE TO OTHER APPLICATIONS

This application is a continuation in part of U.S. patent application Ser. No. 17/340,039 entitled VACUUM CELL WITH ELECTRIC-FIELD CONTROL filed Jun. 6, 2021, which claims priority to U.S. Provisional Patent Application No. 63/044,571 entitled VACUUM CELLS WITH INTEGRATED ELECTRIC FIELD CONTROL FOR ATOMIC PARTICLES filed Jun. 26, 2020, both of which are incorporated herein by reference for all purposes; and is a continuation in part of U.S. patent application Ser. No. 17/493,155 entitled PULSED-LASER MODIFICATION OF QUANTUM-PARTICLE CELLS filed Oct. 4, 2021, which claims priority to U.S. Provisional Patent Application No. 63/150,440 entitled VACUUM CELL MANUFACTURING USING PULSED LASERS filed Feb. 17, 2021, both of which are incorporated herein by reference for all purposes.

BACKGROUND OF THE INVENTION

Ultra-cold matter physics typically involves atoms contained in cold-atom cells that provide a hermetically sealed environment. Cold-atom cells typically include transparent walls and/or windows to allow laser beams and, e.g., in radio-frequency (RF) sensing applications, RF wavefronts to transmit into the cell. Cold-atom cells can also include electrical feed-throughs for providing power and controlling and sensing electrical and magnetic fields. The electrical feedthroughs can be of high-conductivity metal (platinum or copper plating), the opaqueness of which constrains transmission of light and RF wavefronts. In addition, the feedthroughs typically extend through cell walls, presenting points of failure in the hermetic sealing. What is needed are feedthroughs that provide for electrical connectivity with reduced risk of breaching hermetic seals and reduced constraints on optical and RF access to the cell interior.

BRIEF DESCRIPTION OF THE DRAWINGS

Various embodiments of the invention are disclosed in the following detailed description and the accompanying drawings.

FIG. 2 depicts an embodiment of a quantum particle cell.

FIG. 5A is a gray-scale front elevation view of a vacuum cell assembly.

FIG. 5B is a rear elevation view of the vacuum cell assembly of FIG. 5A.

DETAILED DESCRIPTION

The present invention provides for manufacture of a quantum-particle cell (QPC) system using laser modification of transparent conductive oxide (TCO) to form high-resistivity boundaries for separating high-conductivity regions of TCO. TCOs, e.g., indium titanium oxide (ITO), can be applied as films on transparent walls (e.g., of glass or sapphire) to provide electrical paths and field plates that are sufficiently conductive for many QPC applications. Lasers can be used to heat and anneal TCOs so as to increase their resistance by at least an order of magnitude. For example, annealing can increase the resistance of indium tin oxide (ITO) from 1 ohm to 100 ohms. Herein, the high conductivity/low resistivity TCO is referred to as "σ-TCO", while the high resistivity TCO is referred to as "Ω-TCO". High-power fast (e.g., pico-second and femto-second) pulsed lasers can be used so that the annealed locations can be precisely defined. Accordingly, the present invention provides for a TCO film in which transparent conductive regions are separated by transparent quasi-insulative high-resistivity regions.

The present invention provides for manufacture of a quantum-particle cell (QPC) system using laser modification of transparent conductive oxide to form high-resistivity boundaries for separating high-conductivity regions of TCO. TCOs, e.g., indium titanium oxide (ITO), can be applied as films on transparent walls (e.g., of glass or sapphire) to provide electrical paths and field plates that are sufficiently conductive for many QPC applications. Lasers can be used to heat and anneal TCOs so as to increase their resistance by at least an order of magnitude. For example, annealing can increase the resistance of indium tin oxide (ITO) from 1 ohm to 100 ohms. Herein, the high conductivity/low resistivity TCO is referred to as "σ-TCO", while the high resistivity TCO is referred to as "Ω-TCO". High-power fast (e.g., pico-second and femto-second) pulsed lasers can be used so that the annealed locations can be precisely defined. Accordingly, the present invention provides for a TCO film in which transparent conductive regions are separated by transparent quasi-insulative high-resistivity regions.

Figure 1:
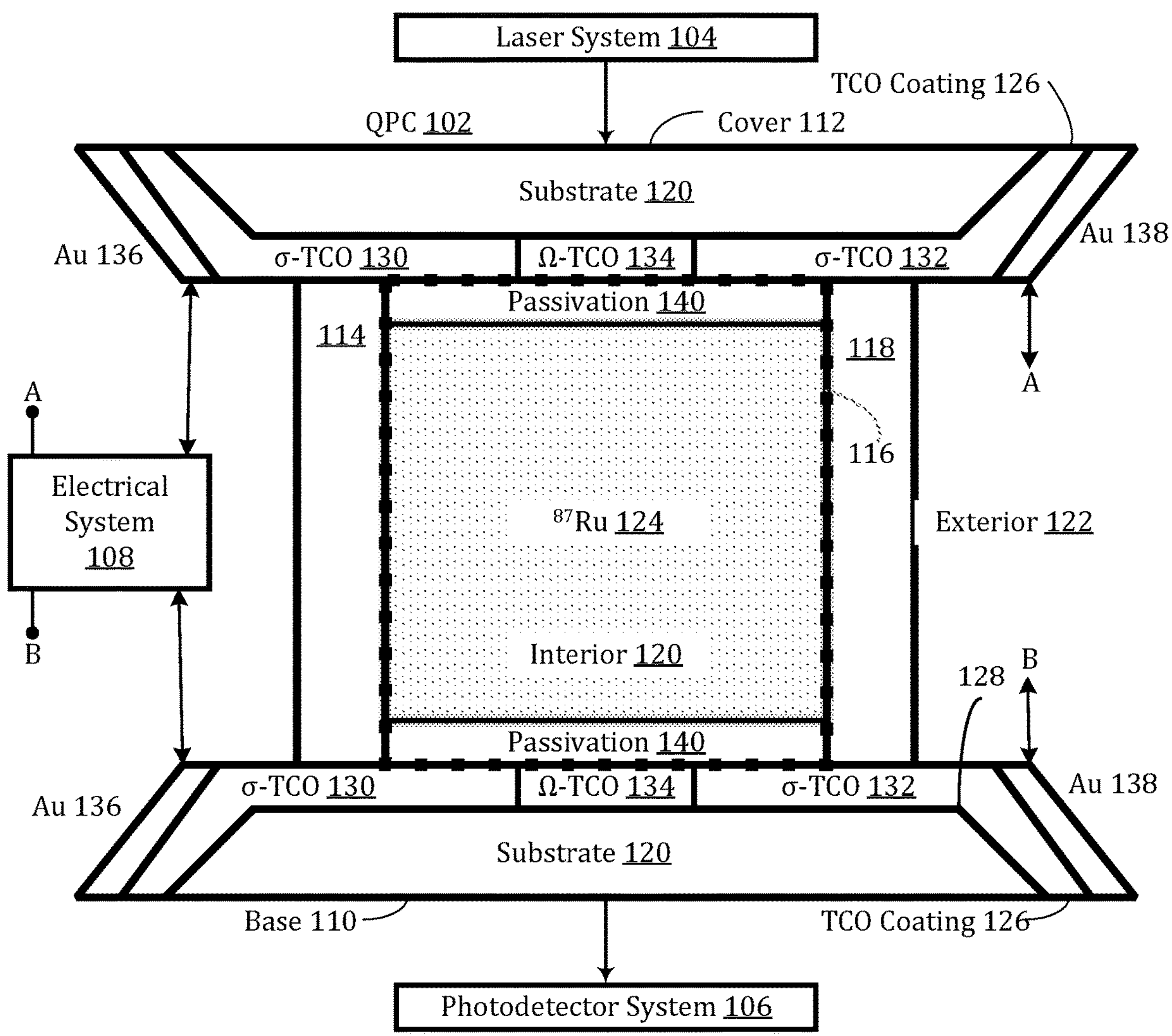
FIG. 1 depicts an embodiment of a quantum particle cell system.

For example, a QPC system 100, shown in FIG. 1, includes a QPC 102, a laser system 104, a photodetector system 106, and an electrical system 108. QPC 102 includes a base 110, a cover 112, and sidewalls including sidewalls 114, 116, and 118, defining a cell interior 120 and a cell exterior 122. Interior 120 is populated by a vapor of quantum particles 124, in this case, neutral rubidium 87 ($^{87}$Rb) atoms. Other QPC can contain other isotopes of rubidium, other alkali atoms, other charged and neutral atoms, and/or neutral or charged molecules, or other molecular entities.

Base 110 includes a glass substrate 120; other embodiments can use other transparent materials, such as sapphire. Cover 112 is a mirror image of base 110 and its components are given the same reference numbers as the corresponding components of base 110. Base 120 has a TCO coating 126 that covers an interior-facing surface of substrate 120, including portions of surface 128 extending into exterior 122. TCO coating 126 is of indium ITO; other embodiments use TCO films such as ZTO (zinc) or FTO (Fluorene). Compounds and films containing graphene, silver and more, are used where the post coating/plating can include an annealing or reacting step using ultrafast or other highly localized radiation to induce an annealing, diffusing, or bonding effect with the substrate or between layers so as to change the resistivity while minimally changing the surface topography. TCO coating 126 includes unannealed σ-TCO regions including regions 130 and 132 and annealed Ω-TCO regions including Ω-TCO region 134. The interposition of high-resistivity region 134 between high conductivity and low resistance σ-TCO regions 130 and 132 allows regions 130 and 132 to be maintained at different electrical potentials as current flows between them and through high-resistance region 134.

TCO contacts 136 and 138, which can be metal coated, are formed on exterior portions of σ-TCO regions 130 and 132, respectively. Electrical drive system 108 is connected to contacts 136 and 138 so as to control and/or sense their voltage potentials. Accordingly, σ-TCO regions 130 and 132 serve as electrical feedthroughs to the interior 120, for example, to control or sense electrical fields within interior 120. A passivation layer 140 disposed on a portion of TCO coating 126 in interior 120 protects the TCO from contact by quantum particles 124 and/or reduces volatility during high energy processes.

TCO coating 126 extends from interior 120 to exterior 122, going between sidewall 116 and substrate 120. Advantageously, Ω-TCO region 134 is the same thickness as σ-TCO regions 130 and 132. Otherwise, a gap would exist where Ω-TCO region 134 passes under sidewall 116. This gap would have to be addressed somehow to ensure a hermetic seal, possibly resulting in failure vulnerability. Ω-TCO region 134 is formed by using a fast (pico-second or femto-second) pulsed laser (e.g., of laser system 104) to anneal TCO. This annealing process has negligible impact on the TCO thickness, providing for a more secure hermetic seal once sidewall 116 is bonded to base 110.

As shown in FIG. 2, TCO coating 126 includes orthogonal Ω-TCO regions 134 and 234 that divide TCO coating 126 to define four σ-TCO regions 130, 132, 230, and 234. Ω-TCO region 134 extends under sidewalls 116 and 216, while Ω-TCO region 234 extends under sidewalls 114 and 118. Combined with the like features of cover 112 (FIG. 1), a total of eight σ-TCO regions are available to serve as field plates for the detection and control of electric fields in cell interior 120. These plates can be used to establish a uniform electric field or some alternative electric field distribution as desired. In addition, the currents through the TCO regions can be used to detect non-uniformities and other deviations from desired distributions so that they can be corrected.

Figure 3A:
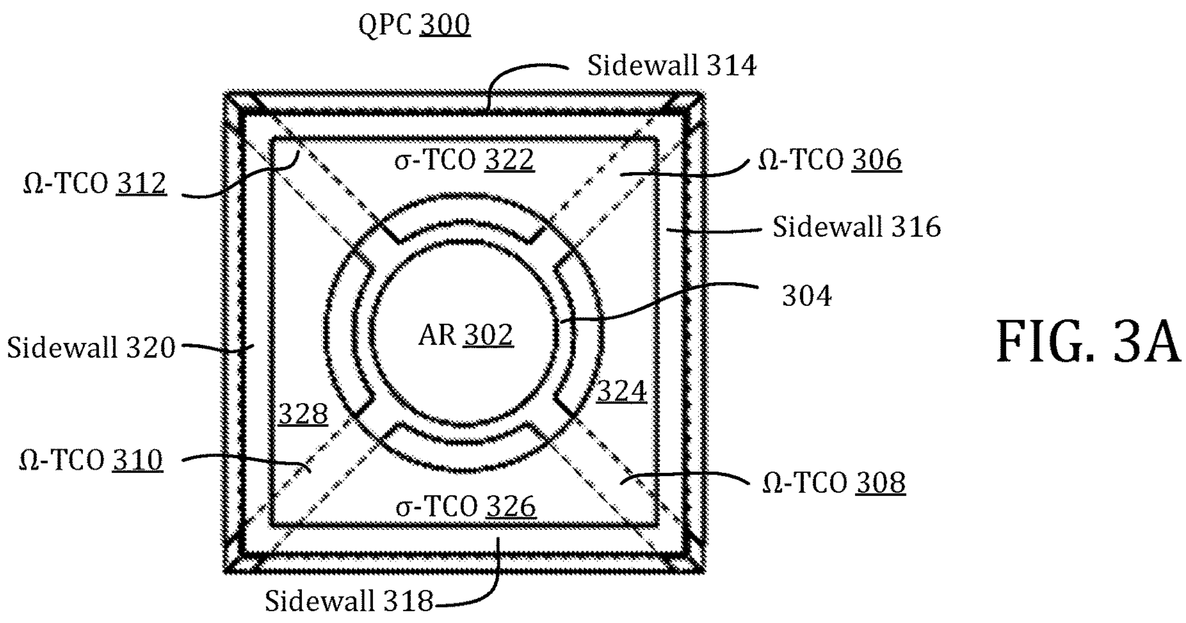
FIG. 3A is a schematic plan view of a quantum-particle cell.
Figure 3B:
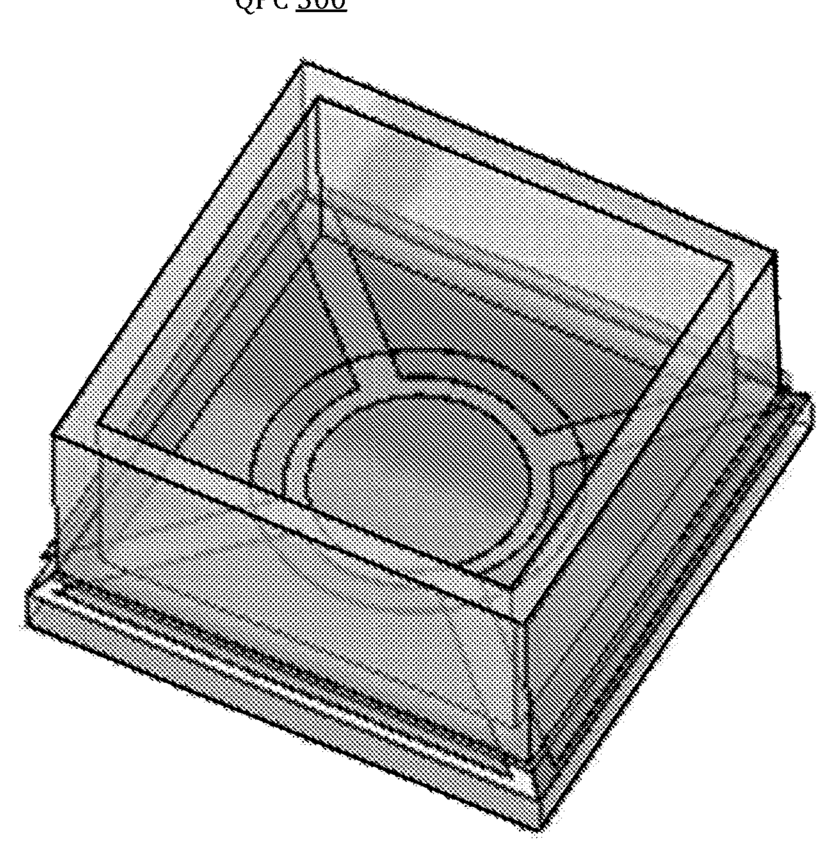
FIG. 3B is a gray-scale isometric view of the quantum-particle cell of FIG. 3A.

Another QPC 300, shown in FIGS. 3A and 3B includes a central anti-reflection (AR) coated region 302. Region 302 is masked when TCO 304 is deposited, and the AR coating is masked so that the TCO and AR regions do not overlap. A ring-shaped Ω-TCO region 304 electrically isolates the AR coated region 302 from electric potentials established on σ-TCO regions. Four Ω-TCO regions 306, 308, 310, and 312 extend diagonally from region 304, under respective corners where adjacent pairs of sidewalls 314, 316, 318, and 320 meet to define σ-TCO regions 322, 324, 326, and 328. σ-TCO regions 322, 324, 326, and 328 can serve as field plates. A passivation layer 330 protects the TCO from quantum particles; in some embodiments, this passivation layer is omitted. Exposed regions may be locally plated with conductive metal or oxide coatings having thicknesses or natural reactivities to the quantum particle/species to mitigate or obviate the risk of sorption or harmful interaction which might affect the exposed electrodes performance. Platinum is often a preferred noble metal in quantum particle cells for such high conductivity low reactivity, but copper, graphene or other materials can be used.

Figure 4:
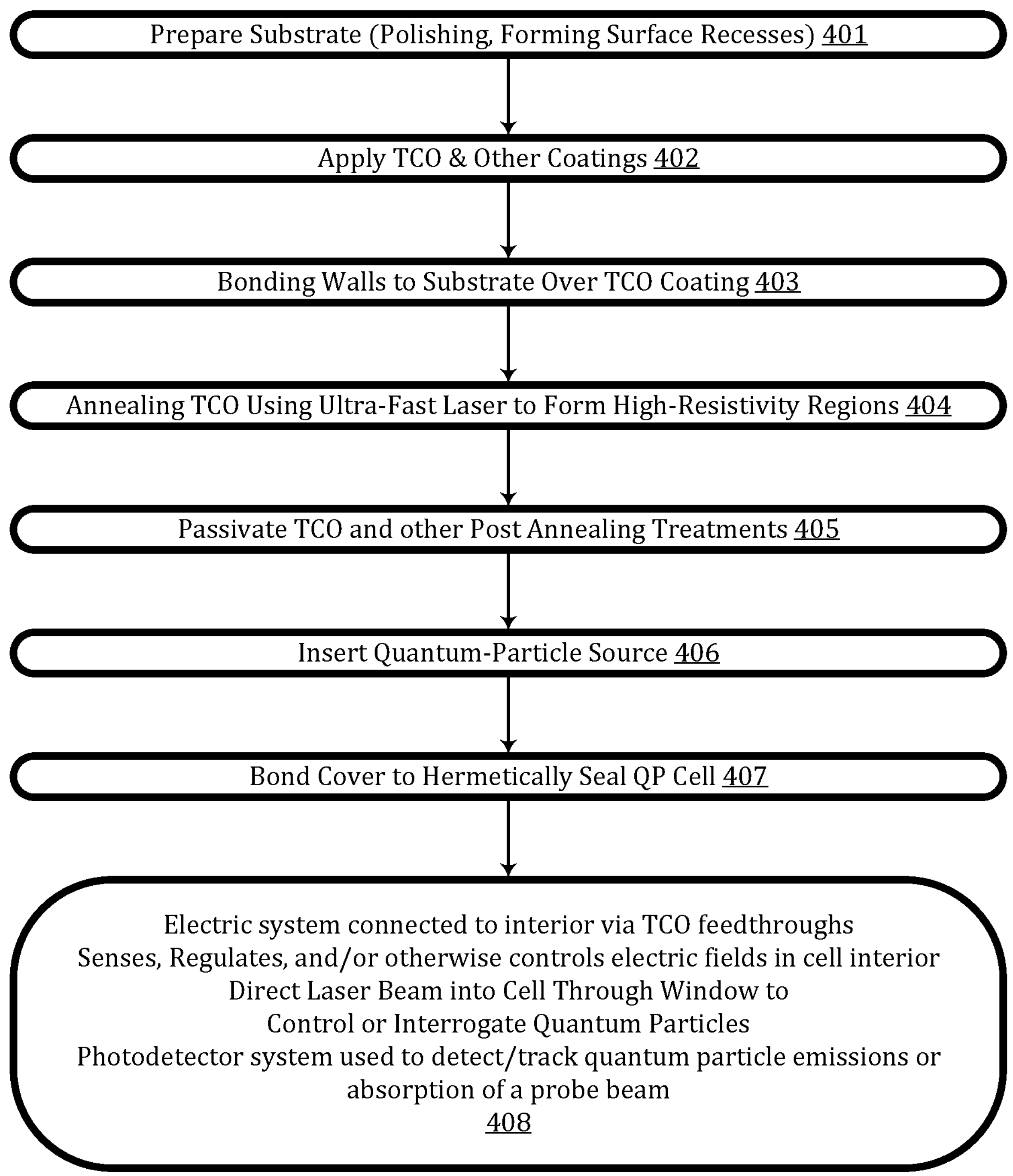
FIG. 4 is a flow chart of a process for making and using a quantum-particle cell system.

A quantum-particle cell process for making and using a QPC is flow-charted in FIG. 4. At 401, a substrate is prepared. This can include polishing a substrate of glass or other transparent material, at least at a central region and bonding regions. In some cases, this can also involve forming trenches into which depositions are to be made; for example, this could be done so that a deposited layer can be level with the surface outside the trenches that is masked from the deposition. For example, regions about the eventual location of an optical window and a bonding perimeter can be provided with smooth transitions to make electrodes recessed and to provide flexure compliance to atmospheric vacuum differential pressure so as to allow the central window to stay flatter. These smooth transitions can be made by polish, e.g., machining, diamond turning, etching, water jetting. This process can be applied to more than one wall or other structural components of a cell.

At 402, a TCO coating is applied uniformly or patterned to a surface of the prepared substrate. In the embodiments in which trenches are formed, the TCO coating can be deposited in the trenches. In some embodiment, the TCO deposition is masked, e.g., from a central region. An anti-reflective coating can be applied to the central region, which is to be used as an optical window for laser access. The AR coating can be applied before or after the TCO coating. In some embodiments, the TCO coating can be passivated by depositing $Al_2O_3$, silicon nitride or plating with metal to protect the TCO coating from alkali or other quantum particles; depending on the embodiment, this passivation involves or does not involve masking. In some embodiments, contact pads can be formed by masking and plating TCO in the cell exterior and/or field-plate pads and be formed in the cell interior to achieve optimum uniform surface charge and for connectivity. A barrier non-conductive coat can be put over in masked fashion so that the electroplating does not require masking.

At 403, sidewalls or one or more other cell structure components are bonded to the substrate through the TCO coating (and any applied passivation). Typically, there would be four glass sidewalls bonded to the substrate, which would serve as a base for the parallelepiped cell being manufactured. Six sidewalls can be bonded in the case of a cell with a hexagonal cross section. In the case of a channel cell or framed cell, the substrate can be bonded to one of cell's sides. Contact, anodic, ultrafast laser, eutectic, diffusion, etc., bonding can be used to effect the bonds. The bonding must avoid shorting discrete σ-TCO regions. If shorts result from bonding, the shorts can opened without compromising vacuum seal established by the bonding. barrier non-conductive coat is put over in masked fashion.

At 404, portions of the TCO coating are annealed to form high resistance Ω-TCO regions and electrically divide the remaining σ-TCO regions coating into high conductance and low resistance σ-TCO regions. These σ-TCO regions are to serve as electrical feedthroughs, current paths, and field plates. The annealing can be performed using a high-powered ultrafast (pico-second or femto-second) pulsed laser in air or other oxidizing environment or, depending on the facilitated reaction, in vacuum or solution. The short high-powered laser pulses provide highly localized peak heat to anneal localized regions while delivering limited total heat to prevent annealing outside the targeted area. The annealing is applied to write high-resistance trace gaps between selected field plates and their connection paths. The writing can occur on the interior, the exterior, and in the bonding region. The writing to the bonding region can involve directing laser beams through the substrate or through structure(s) bonded to the substrate prior, during, or after bonding/assembly. The annealing can involve diffusion. The annealing can involve ablation away from the bonding region, but, through the bonding transition, the writing is not ablative since the thickness of the TCO in the bond region is to be kept uniform to ensure a hermetic seal.

At 405, in some embodiments, passivation and/or other treatments are applied after annealing. Passivation can be performed in addition to or in lieu of passivation performed at 402. Atomic layer depositions (ALD) can be used to passivate or coat or protect the layers right up to and over the bond edge to the abutting cell components/transitions.

At 406, quantum particles are or a quantum particle source is introduced to the cell interior. Typically, this introduction can occur before a cover is bonded to enclose the cell at 407. For example, an open cell (without the cover) can be enclosed in a vacuum environment. A vapor of quantum particles can be introduced, and the cover bonded to confine some of the quantum particles. Alternatively, an ampule or other source can be inserted into the cell that can be heated or otherwise activated to release quantum particles to the cell interior upon demand (after the cell is hermetically sealed). In some embodiments, quantum particles can be injected into the cell, e.g., through a pinhole, from another cell hermetically sealed from the ambient.

At 407, the cover can be bonded to seal and complete the cell. In some embodiments, the cover is part of the structure bonded to the substrate at 403. In such embodiments, the annealing is conducted through a fully-formed cell structure. Passivation can be implemented by releasing metal or metal oxide precursors, or other precursors from a filament to electroplate the σ-TCO regions under vacuum or controlled atmosphere.

At 408, electric fields and/or currents are sensed and/or controlled via the TCO feedthroughs. The electric fields can be regulated by adjusting electric parameters in response to measurements of electric parameters. Laser beams can be directed into the cell to control and/or interrogate quantum particles and, in particular, the quantum states of the quantum particles. A photodetector system can be used to track quantum particle emissions and/or quantum particle absorptions of a probe beam.

As shown in FIGS. 5A and 5B, a vacuum-cell assembly 500 includes a vacuum cell 502 supported by a source structure 504 that supplies cold neutral atoms to vacuum cell 502. Vacuum cell 502 includes eight electrode assemblies 506, four integrated with a front wall 508 as shown in FIG. 5A, and four integrated with a rear wall 510, as shown in FIG. 5B. Each electrode assembly includes an electrode 512 formed and contained in a trench in a vacuum facing surface of the front or rear wall, a contact 514 bonded to an ambient-facing surface of the front or the rear wall, and a via 516 connecting the respective electrode to the respective contact. As indicated in FIGS. 5A and 5B, the vias extend into respective contacts to ensure secure electrical connections. Gaps 518, which are parts of the walls, electrically isolate electrodes 514 from each other. Alternatively, electrodes can be isolated by annealing TCO between electrodes to form high resistance boundaries between electrodes.

The four electrodes 514 on front wall 508 collectively define a circular area on the vacuum-facing surface of wall 508, that, when projected orthogonal to the page and through wall 508, defines an unoccluded optical front window 520. Front window 520 provides optical access to the cell interior from the cell exterior. Electrodes on rear wall 510 similarly define a rear window 522 into the cell interior. The two windows 520 and 522 cap a cylindrical volume that contains a target region at which electrical field distributions are to be controlled. For example, the target region can include a qubit register. Note that the vias 516 and contacts 512 are further away from the respective windows 508 and 510 than are the electrodes to minimize any effects of the vias and contacts on the electric fields in the target region.

Figure 6B:
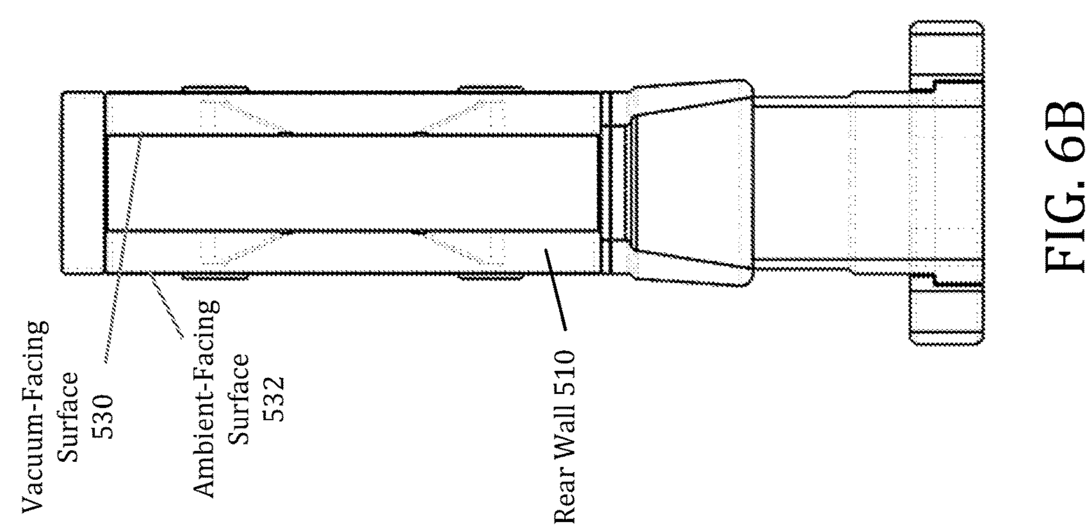
FIG. 6B is a left side elevation view of the vacuum cell assembly of FIG. 5A.
Figure 6A:
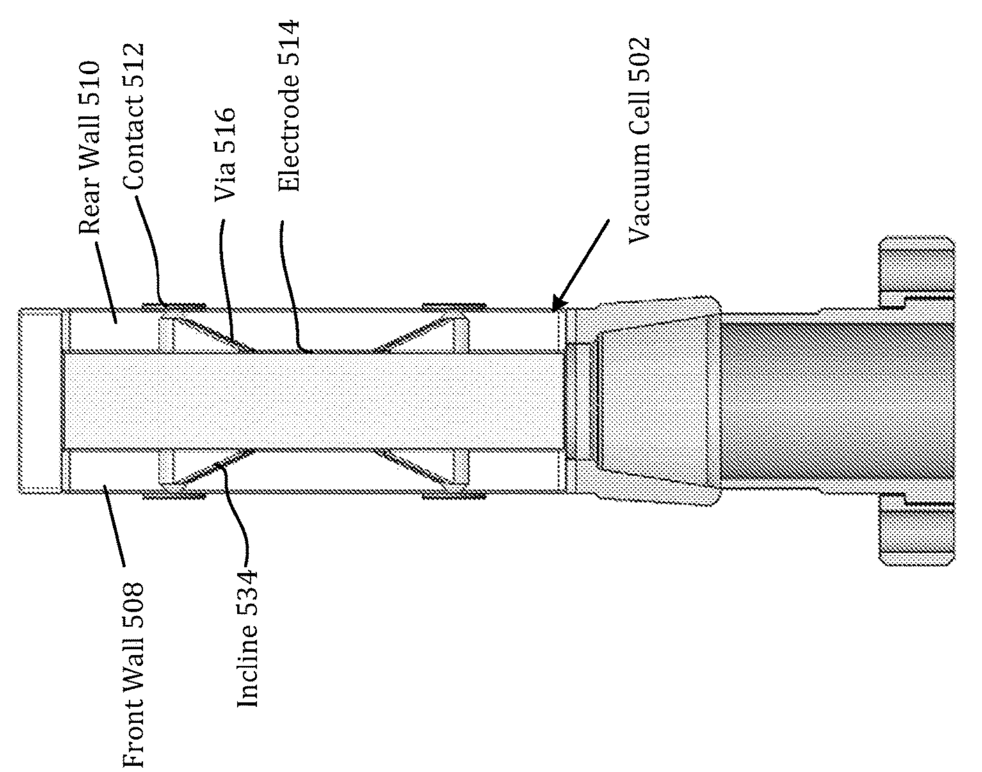
FIG. 6A is a gray-scale right side elevation view of the vacuum cell assembly of FIG. 5A.
Figure 7B:
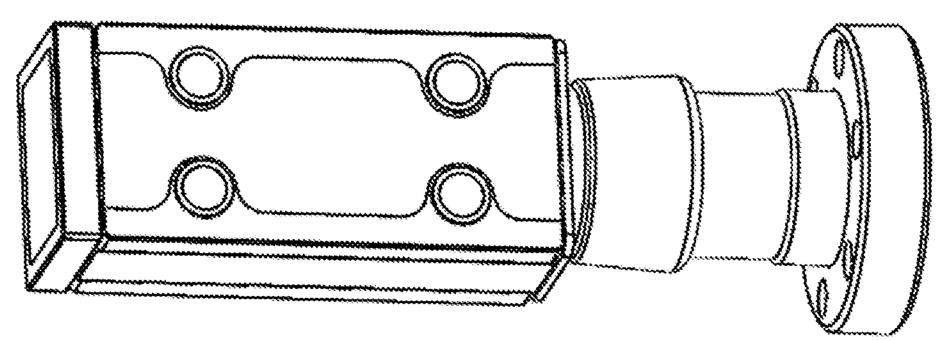
FIG. 7B is another perspective view of the vacuum-cell assembly of FIG. 5A.
Figure 7A:
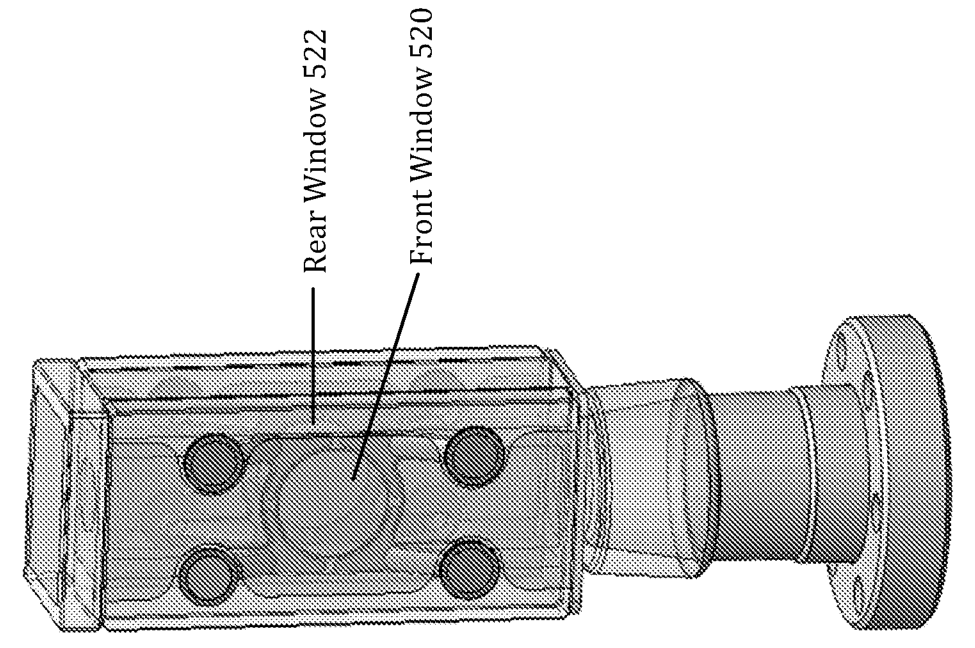
FIG. 7A is a gray-scale perspective view of the vacuum cell assembly of FIG. 5A.

As shown in FIGS. 6A and 6B, each wall 508 and 510 has a vacuum-facing surface 530 and an ambient-facing surface 532. Since contacts 512 are further from respective windows 520 and 522 than are the electrodes, vias 516 extend along inclines 534 from electrodes 514 to contacts 512, as is apparent in FIGS. 6A and 6B. FIGS. 7A and 7B are perspective views of vacuum cell assembly 500. Front and rear windows 520 and 522 are aligned so that, for example, absorption spectra resulting from illumination through the front window can be detected as the light exits the rear window.

In an embodiment, electrodes are directly plated to the inside surfaces of walls of an assembled cell. However, this can be difficult as evaporation or plating (outside of chemical vapor deposition (CVD), Atomic Layer Deposition (ALD), and similar non-line-of-sight (non-LOS) processes) require difficult masking at sheer angles with a complex motion to plate an inside surface uniformly and thoroughly. Some embodiments stretch out a filament or filaments with a thin long support bar so the wires or elements can be installed temporarily within the partially enclosed cell walls to evaporate, plate, sputter, etc. onto the inner surfaces. A similar process is executed for non-evaporable getter (NEG) coatings in ring colliders and can be done with almost any sputter, evaporation, or targeted beam coating technology. Some processes using non-LOS coatings utilize sprung, clamped, conformal, or sacrificial masks to control deposition regions on unassembled, partially assembled, or fully assembled cells.

Since it can be difficult to form the electrodes in an assembled cell, the illustrated embodiments perform plating on the walls before the walls are assembled to form the cell. These embodiments use a type of trenched field plate nominally recessed from the bonding surface in a manner that facilitates compact, complex plate and cell geometries while minimally complicating assembly. When the walls are assembled via bonding schemes such as transient liquid phase (TLP), anodic, contact, or other type of bonding, the electrode itself survives the subsequent bonding steps and minimally interferes or complicates the bonding schemes.

In the illustrated embodiments, trenches are recessed regions of cell walls that exist at least in part, from the active area of the field plate itself to the electrical feedthrough or electric potential generating element. Without such a recess, in at least some critical regions near a bond seam or cell wall joint, a standard plating would typically be proud of the base plane, even if only by a few hundred nanometers for typical evaporations. With the tight conformity requirements of direct bonding such as anodic bonding or other form of contact bonding, a raised step of the coating may prevent hermetic sealing even with a large gradient or feathered plating making a smooth transition in thickness.

By forming a trench and then plating into the trench, relatively thick plating can be deposited without interfering with bonding; this allows for plating to go right up to or even slightly overrunning the bond perimeter without preventing hermetic sealing. Thus where a few hundred microns to a millimeter of spacing may have been required between a bond seam and a field plate to ensure bondability, now zero spacing may be achieved. This loosening of the tolerances for parts provides for extremely compact vacuum-cell designs.

A trench is relatively simple to fabricate through subtractive grinding, masked etching similar to MEMS processes, rastered etching or ablation such as with pulsed lasers or laser assisted etching, ultrasonic machining, melted displacement, erosion, molding, and other means. Other methods of material removal maybe ion or plasma etching, ultrasonic milling/sinking, grinding, local thermal reflow/stamp displacement, laser machining or ablation, and even additive methods such as growing or sputtering the negative of the trench which may in turn be re-surfaced or not. Further, in most designs, a single sided machining/forming operation suffices for making scalable fabrication easier. What matters is the top/bonding plane is uninterrupted by any protrusions. In practice, a chemical etch of one micron (1 μm) deep is more than enough to accommodate most practical evaporation or sputter plating.

A further advantage of plating within a trench is that the recessed nature of the resulting plating helps prevent damage to the conductive plate; this is especially helpful if the conductive plate is fairly thin or has narrow or high-density traces that might otherwise be easily broken or shorted. Deeper trenches would further act as shadow masks if conductive species such as alkali metals are intentionally injected into a chamber that has trenched platings. For relatively high vapor pressure species such as rubidium, a getter in the chamber can be used to prevent eventual migration and condensation by background thermal means.

Vacuum chamber walls can be subject to deflection due to the pressure differential between interior and exterior of the vacuum cell. This deflection can cause optical distortion on beams passing through optically transparent cell walls. Trench profile and location can help to alleviate this in several ways. In an embodiment, where a trench would cause higher order or less desirable aberration by removing material, the trench depth can be modulated to maintain stiffness in some regions while adding more flex in other regions. In an embodiment where material removal would be problematic for the overall deflection or structural integrity, the trench can be as little as a few hundred nanometers (nm) deep and have smooth etch profiles achieved with post machining etching. In the illustrated embodiments, the trench profile is made sufficiently deep and circularly symmetric about a window to minimize distortion through the window; any increased aberration away from the window is of little concern since the wall away from the window is not used for laser beam transmission requiring low wavefront error.

Other embodiments use direct bonding reinforcers such as thicker window addons or perimeter rings to flatten and/or make such windows locally more rigid. Such bonding can be implemented by anodic or other form of contact bonding, or hydroxide bonding. In some embodiments, such reinforcements can serve as mounting platforms for internal or external optics, alignment keys or tools, or can themselves serve purposes such as light absorbers or a surface or structural support for a getter material near the most sensitive part of the cell.

Some embodiments establish a passive grounded conducting plane through as much of the cell as possible to collect and disperse errant charges that would otherwise build-up. The passive grounded conducting plane can be in addition to or in-lieu of active field plates. While field plates and the feedthroughs connecting them to the outside world may exhibit impedances up to mega-ohms, as they simply must facilitate a desired charge in an area, grounded planes require higher uniform conductivities throughout the cell to ensure charge gradients do not build. Further, where field plates need to be switched quickly or operate as AC fields, high conductance/low impedances are required across the plate and connecting feedthrough.

In embodiments, impedances are tailored not only through geometry and thickness of the conductive plating but are also controlled with parallel conductors with small insulating gaps, annealed TCO, or even multi-stack laminate plating with insulating layers such as silicon dioxide ($SiO_2$) or other dielectrics. Such layers are especially useful for helping to establish waveguides, shielded wires to minimize interference and cross talk, and running radio frequency (RF) coaxial "cables". Such layers may also be useful for "stacking coils" or traces to form efficient compact electromagnets. Layered conductors and insulators, especially with at least one being optically transparent, are used to make integrated optical modulators such as spatial light modulators, liquid-crystal-like modulators, electro-optical and acousto-optical modulators integrated into windows, optical switches, waveguides, and feedthroughs.

Depending on the embodiment, electrodes and vias can be of highly conductive metals such as gold, silver, platinum, palladium, copper, or stainless steel. The material choice may be dictated not only by the desired conductivity but chemical reactivity: for example, alkali metals can adversely attack metals like gold, while copper can oxidize when subjected to elevated temperatures. Modifications to the assembly/fabrication process such as with inert gases, vacuum purging, or thin passivation layers with noble, low-reactivity metals, such as platinum, TCO's or dielectrics can be used to protect against harmful chemical interactions.

Various dielectrics can be chosen as insulators such as $SiO_2$, SiN, and others. More interestingly, indium-tin-oxide (ITO) and other transparent conducting oxides can be used to establish conductivity while also allowing optical access through the conductor, where metals would otherwise occlude the clear optical path or require thicknesses too thin to be effective electrically. Alternatively, clever use of field plates put down on sufficiently polished surfaces may turn a field plate (e.g., electrode) into a beam reflector; the reflector can fold the optical path in an advantageous way whereas the plate would have otherwise prevented optical access such as applying dielectric protected gold coatings like commercial mirrors. Insulative layers can likewise also exist as polarization elements integrated within the stack or platings to the backside of such elements.

More exotic materials such as sapphire, photorefractive crystals, or other optically active or interesting materials can be used and integrated into the assemblies. They can be grown, deposited, bonded, laminated, coated, or even comprise the bulk of the window material. These exotic materials can enable more integrated electro-optical systems for faster on-board or in-cell control, feedback, and interfacing.

One of the biggest strengths of this technology is the ability to form a simplistic vacuum electrical feedthrough by tapering the trench down, generally away from the field plates, until the backside/ambient side of the substrate is breached. Ideally this taper terminates at a hole with a perfectly sharp edge such that a single top-down line-of-sight metallization or plating forms a continuous conductive path from the field plate down to the conductor used to seal the backside breach. However, most machining operations or even post machining handling can result in some breakout or chipping which may prevent a continuous line-of-sight ramp down to the backside.

Therefore, some embodiments pre-bond a conductor or sacrificial support material to where the trench should breach to enable plating up to and on the conductor. One method of achieving this on a borofloat, Pyrex®, SD-2 or similar window is to bond small pads of thin high conductivity silicon to the backside of the glass at the breach point. The machining/etching can then go at least 1 μm (though preferably not more than 100 μm) into the silicon, breaching its native oxide so that the conductive plating makes good electrical contact to the silicon. Silicon conductive pads as thin as a couple hundred microns can seal holes as small as a few tens of microns so as to allow for low current high potential driving of the electric field plate. Subsequent plating, with or without trenching, can be deposited onto the backside of the feedthrough window to run out to a location where electrical mechanical contacts may be bonded to interface with an electrical driving system. Metallization of the trench down to the silicon interface can be made cheaply via LOS methods such as sputtering or evaporation, as well as chemical vapor deposition (CVD) or even ultrasonic soldering, solder reflow, electroplating etc. as well as combinations of the above depending on the desired characteristics of the metalized layer. In some embodiments, the coating is a TCO.

Combining materials such as ITO and $SiO_2$ with MEMS fabrication techniques, depositions, and post polishing, one can etch trenches of depths slightly less than the intended ITO and $SIO_2$ stack up layer to be deposited/grown to completely fill in the trench. The excess is then polished down to the original base plane (so the electrodes are flush with the walls) thereby having a completely uninterrupted surface for bonding or optics that still has patterned conductive traces. Over such an uninterrupted surface, high precision bonding practices such as contact, silicate, transient liquid phase (TLP), or hydroxide bonding can be used to achieve hermetic seals and allow the traces to continue to the ambient side of the cell for electrical connection.

Electrodes can also be formed from a single deposition operation of a transparent conductive oxide (TCO), such as ITO. The deposition can be performed with a patterning or etching scheme. The conductive oxide can be less than 400 nm thick and the materials and geometries used are sufficiently compliant, especially when feathered or tapered to avoid abrupt patterned edge boundaries. This allows for direct bonding (e.g., anodic, contact, hydroxide, etc.) over the patterned electrodes such that a hermetic seal is still effectively formed. As long as the TCO individual "traces" or plates are continuous from the vacuum side through the bond interface to the ambient side, even if just exposed on a thin edge along the ambient bond seam, then an effective electrical feedthrough or array of feedthroughs is established.

Another scheme involves the uniform or near uniform (partially patterned) coating of a TCO onto a single side plate especially if the plate had minor chamfers or beveled edges, for example, of 10-500 um. In that example, the TCO continuously transitions from the flat bonding plane to the beveled edges. Then, before, during, or even after bonding to the sidewalls or rest of the chamber, the transparent plate with transparent TCO gets a surface modification or treatment to locally anneal or degrade the conductivity of the TCO. This degradation is performed so as to avoid significantly changing the TCO's structural properties such as thickness or surface polish. In effect, a pattern is written into the conductor electrically while leaving it mechanically minimally modified to enable hermetic bonding to the surface. In this manner the individual traces/electrodes are connected by higher resistivity regions; then, establish a bias between adjacent effective "electric field plates" or regions, a constant current can flow between the plates or regions through the higher resistivity boundaries written or patterned into the TCO, e.g., electrically or using pulsed lasers.

Depending on the embodiment, the integrated devices can include field-modulated waveplates or cavity tuning windows/mirrors/gratings utilizing layered transparent conductors and insulators. Tunable anti-reflective (AR) and highly reflective (HR) coatings can be applied via heat, electrostatics, or other electrical transduced effects. Traces can be imbedded and bonded to discrete or monolithically imbedded integrated circuits (ICs), semiconductor devices, mechanical actuators, transducers, antennae, optical or RF focusing elements, metamaterials, or analogs of such components or even entire sets including systems of such components.

Depending on the embodiment, such structures as mentioned previously can also be fabricated by subtractive or additive processes. Applicable additive processes include deposition, plating, sputtering, CVD, growth, self-assembly processes, and 3D printing. The resulting structures can then be polished down to affect a uniform hermetic seal. Further, deposited or grown materials can be in part or fully converted in their entirety or in masked patterns such as from silicon to $SiO_2$, thus turning a semiconductor into an insulator making seamless monolithic integrated components and traces. Such conversion results in changes in material expansion and so typically works best with thin films and requires repolishing prior to bonding. Further, ion implantation alter conductivity in rastered or masked patterns as well for integrated conduction paths or as a means of hardening to or accelerating etching processes.

The electric-field gradients achievable using the resistive strips is limited by their resistivity. Steeper gradients could be attained by removing ITO material rather than simply converting it. However, doing so would change the coating thickness, compromising the hermetic seal where the ITO material extends under or over the sidewall structure. A patterned deposit of insulator material could be used to restore the thickness lost by removing ITO. However, this deposition would have to occur before cell assembly is complete and may have to be impractically thin.

A major advantage of the pulsed laser conversion of ITO is that it can be performed after cell assembly is complete. This enables a split manufacturing model in which ITO coated blanks are prepared and stored in inventory. The blanks can then have custom patterns of conductive and resistive material written in by pulsed laser to meet customer requirements. Patterning may be performed one focal spot at a time rastering a pattern, diffractively, holographically, interferometrically or by other means using ultrafast pulses. Conductivity change can be a result of annealing, diffusion, oxidation, gas reaction, or ablation.

Embodiments use pico- and/or femto-second lasers for manufacturing and repairing vacuum chambers or cells, thus enabling cold atom and quantum vacuum systems. Embodiments provide for pulsed-laser in-vacuum bonding of similar and/or dissimilar materials, including materials with dissimilar coefficients of thermal expansion (CTEs). Thus, pulsed laser bonding opens the door to a wider range of materials so that, for example, materials with lower helium permeation can be used. (Helium permeation is an increasing concern as surface-area to volume ratios increase as quantum particle cells become more compact especially where active pumps are undesirable.) Use of the pulsed lasers allows bonding of materials with dissimilar CTEs to be done at low temperatures to avoid failure due to thermal cycling.

All such in-vacuum bonding can be performed after vacuum processing to prevent CTE-induced fractures of materials. Such fractures can occur where exposure to water or heat or other bonding processes or their by-products would destroy components. To the contrary, Local heating of glass or sealing materials allows sensitive internal components to be saved. In-vacuum pulsed-laser bonding can be used with low-temperature anodic bonding or in lieu of anodic bonding (e.g., of silicon to glass) where exposure to oxygen produced from anodic bonding could cause harmful reaction to the cell or its contents.

The conductivity/resistivity of the σ-TCO regions may or may not be uniform. To accommodate both possibilities herein, σ-TCO regions can be characterized by a σ-TCO range with a maximum and a minimum value. In the case of σ-TCO regions non-uniform conductivity/resistivity, the maximum and minimum values are different; in the case of σ-TCO regions with uniform conductivity/resistivity, the maximum and minimum values are the same. Similarly, the conductivity/resistivity of Ω-TCO regions can be characterized by ranges. Language to the effect that a first range is "more resistive than" a second range means that the minimum resistivity of the first range is greater than the maximum resistivity of the second range, in which case, the resistivity ranges are non-overlapping.

Herein, a cell is an enclosure defining an interior and an exterior. A "closed cell" is a cell that prevents fluid passage between its anterior and an ambient in the exterior. An open cell allows such fluid passage; for example, bonding a cover to an open cell can result in a closed cell. A closed cell is characterized as hermetically sealed even if fluid communication is permitted with another closed cell.

In one aspect, in general, a process comprises: forming a TCO layer of transparent conductive oxide (TCO) on a first surface of a substrate, the substrate being transparent or including a transparent region, the TCO having a conductivity within a σ-TCO conductivity range and a respective resistance in a o TCO resistivity range; defining a cell interior and a cell exterior by bonding one or more structures to the first surface via the TCO, the first surface extending from the cell interior between the first surface and the one or more structures and into the cell exterior; transforming Ω-TCO regions of the TCO layer so as to increase their resistivities to within a Ω TCO resistivity range, at least one of the Ω-TCO regions extending from the cell interior, between the substrate and the one or more structures, and into the cell exterior, a minimum of the Ω-TCO resistivity range being greater than a maximum resistivity of the σ-TCO resistivity range, Ω-TCO regions separating non-transformed σ-TCO regions from each other; passivating the TCO layer; and inserting quantum particles or a quantum particle source of quantum particles into the cell interior.

Aspects can include one or more of the following features.

The defining provides an open cell.

The process further comprises bonding a cover to yield a hermetically sealed closed cell.

The defining provides a closed cell.

The TCO includes indium tin oxide.

The minimum of the Ω-TCO resistivity range is at least an order of magnitude greater than the maximum of the σ-TCO resistivity range.

Multiple Ω-TCO resistivity ranges are distinctly defined comprising multiple non-overlapping ranges and that each is at least an order of magnitude greater than the σ-TCO resistivity range.

At least one of the σor Ω TCO's comprises an engineered spatial gradient or modulated resistivity from its minimum resistivity to its maximum resistivity within the resistivity range.

The transforming includes directing a laser beam through the substrate or through the one or more structures bonded to the substrate to anneal TCO between the substrate and the one or more structures.

The transforming is performed using a laser with a pulse period of 100 picoseconds or shorter.

The pulse period is 100 femtoseconds or shorter.

The process further comprises forming trenches in the substrate, TCO being formed in the trenches.

In another aspect, in general, a quantum-particle cell system comprises: a cell structure defining a cell interior and a cell exterior and fluidically isolating contents of the cell interior from an ambient in the cell exterior, the structure including a substrate coated with a transparent conductive oxide (TCO) layer including one or more annealed regions of relatively high resistivity and including unannealed regions of relatively low resistivity, the annealed regions electrically isolating unannealed regions from each other, at least one annealed region extending from the cell interior, between the substrate and the rest of the cell structure, and into the cell exterior, at least two unannealed regions extending from the cell interior to between the substrate and the rest of the cell structure, and to the cell exterior; a passivation coating on the TCO within the cell interior; and quantum particles or a quantum-particle source of quantum particles within the cell interior.

Aspects can include one or more of the following features.

The TCO is indium tin oxide (ITO).

The quantum-particle cell system further comprises a laser system for controlling quantum states of the quantum particles by directing laser beams through the cell structure.

The quantum-particle cell system further comprises a photodetector system for tracking quantum transitions of the quantum particles.

The quantum-particle cell system further comprises an electrical system coupled to the σ-regions at portions exterior to the cell to control current or electrical potentials within the interior of the cell.

The electrical system causes current to flow from a first unannealed region to a second unannealed region via an annealed region so as to maintain a voltage differential between the first and second unannealed regions.

The substrate includes a window region that is coated by an anti-reflection (AR) coating and is not coated by TCO.

The substrate includes a window region that is coated by an anti-reflection (AR) coating at least in part comprising the TCO as at least one of its layers.

The TCO is replaced with a thin metal under 200 nm.

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured. Although the foregoing embodiments have been described in some detail for purposes of clarity of understanding, the invention is not limited to the details provided. There are many alternative ways of implementing the invention. The disclosed embodiments are illustrative and not restrictive.

Herein, all art labeled "prior art", if any, is admitted prior art; all art not labeled "prior art", if any, in not admitted prior art. The disclosed embodiments, modification thereto, and variations thereupon are provided for by the present invention, the scope of which is defined by the following claims.

What is claimed is:

1. A process comprising: forming a TCO layer of transparent conductive oxide (TCO) on a first surface of a substrate, the substrate being transparent or including a transparent region, the TCO having a conductivity within a σ-TCO conductivity range and a respective resistance in a σ-TCO resistivity range; defining a cell interior and a cell exterior by bonding one or more structures to the first surface via the TCO, the first surface extending from the cell interior between the first surface and the one or more structures and into the cell exterior, transforming Ω-TCO regions of the TCO layer so as to increase their resistivities to within a Ω-TCO resistivity range, at least one of the Ω-TCO regions extending from the cell interior, between the substrate and the one or more structures, and into the cell exterior, at least two σ-TCO regions of the TCO layer extending from the cell interior to between the substrate and the rest of the cell structure, and to the cell exterior; a minimum of the Ω-TCO resistivity range being greater than a maximum resistivity of the σ-TCO resistivity range, Ω-TCO regions separating non-transformed σ-TCO regions from each other; passivating the TCO layer; and inserting quantum particles or a quantum particle source of quantum particles into the cell interior.

2. The process of claim 1 wherein the defining provides an open cell.

3. The process of claim 2 further comprising bonding a cover to yield a hermetically sealed closed cell.

4. The process of claim 1 wherein the defining provides a closed cell.

5. The process of claim 1 wherein the TCO includes indium tin oxide.

6. The process of claim 1 wherein the minimum of the Ω-TCO resistivity range is at least an order of magnitude greater than the maximum of the σ-TCO resistivity range.

7. The process of claim 1 wherein multiple Ω-TCO resistivity ranges are distinctly defined comprising multiple non-overlapping ranges and that each is at least an order of magnitude greater than the σ-TCO resistivity range.

8. The process of claim 1 wherein at least one of the σ-TCO resistivity range or the Ω-TCO resistivity range comprises an engineered spatial gradient or modulated resistivity from its minimum resistivity to its maximum resistivity within the resistivity range.

9. The process of claim 1 wherein the transforming includes directing a laser beam through the substrate or through the one or more structures bonded to the substrate to anneal TCO between the substrate and the one or more structures.

10. The process of claim 1 wherein the transforming is performed using a laser with a pulse period of 100 picoseconds or shorter.

11. The process of claim 10 wherein the pulse period is 100 femtoseconds or shorter.

12. The process of claim 1 further comprising forming trenches in the substrate, TCO being formed in the trenches.

13. A quantum-particle cell system comprising:

a cell structure defining a cell interior and a cell exterior and fluidically isolating contents of the cell interior from an ambient in the cell exterior, the cell structure including a substrate coated with a transparent conductive oxide (TCO) layer including one or more annealed regions of relatively high resistivity and including unannealed regions of relatively low resistivity, the annealed regions electrically isolating unannealed regions from each other, at least one annealed region extending from the cell interior, between the substrate and the rest of the cell structure, and into the cell exterior, at least two unannealed regions extending from the cell interior to between the substrate and the rest of the cell structure, and to the cell exterior;

a passivation coating on the TCO within the cell interior; and quantum particles or a quantum-particle source of quantum particles within the cell interior.

14. The quantum-particle cell system of claim 13 wherein the TCO is indium tin oxide (ITO).

15. The quantum-particle cell system of claim 13 further comprising a laser system for controlling quantum states of the quantum particles by directing laser beams through the cell structure.

16. The quantum-particle cell system of claim 15 further comprising a photodetector system for tracking quantum transitions of the quantum particles.

17. The quantum-particle cell system of claim 13 further comprising an electrical system coupled to σ-regions at portions exterior to the cell to control current or electrical potentials within the cell interior.

18. The quantum-particle cell system of claim 17 wherein the electrical system causes current to flow from a first unannealed region to a second unannealed region via an annealed region so as to maintain a voltage differential between the first unannealed region and the second unannealed region.

19. The quantum-particle cell system of claim 13 wherein the substrate includes a window region that is coated by an anti-reflection (AR) coating and is not coated by TCO.

20. The quantum-particle cell system of claim 13 wherein the substrate includes a window region that is coated by an anti-reflection (AR) coating at least in part comprising the TCO as at least one of its layers.

21. The quantum-particle cell system of claim 13 wherein the TCO is replaced with a thin metal under 200 nm.

* * * * *